(12) United States Patent
Picard

(10) Patent No.: US 11,509,230 B2
(45) Date of Patent: Nov. 22, 2022

(54) POWER STAGE CONTROLLER FOR SWITCHING CONVERTER WITH CLAMP

(71) Applicant: TEXAS INSTRUMENTS INCORPORATED, Dallas, TX (US)

(72) Inventor: Jean Picard, Hooksett, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 119 days.

(21) Appl. No.: 16/938,573

(22) Filed: Jul. 24, 2020

(65) Prior Publication Data

US 2021/0143742 A1 May 13, 2021

Related U.S. Application Data

(60) Provisional application No. 62/932,358, filed on Nov. 7, 2019.

(51) Int. Cl.
| | |
|---|---|
| *H02M 3/335* | (2006.01) |
| *H03K 5/24* | (2006.01) |
| *G01R 19/165* | (2006.01) |
| *H02M 1/00* | (2006.01) |

(52) U.S. Cl.
CPC .. *H02M 3/33592* (2013.01); *G01R 19/16528* (2013.01); *H03K 5/24* (2013.01); *H02M 1/0006* (2021.05); *H02M 1/0009* (2021.05); *H02M 1/0025* (2021.05)

(58) Field of Classification Search
None
See application file for complete search history.

(56) References Cited

U.S. PATENT DOCUMENTS

| | | | | |
|---|---|---|---|---|
| 6,947,272 B2* | 9/2005 | Daniels | ................ | H03K 17/302 361/93.7 |
| 7,180,274 B2* | 2/2007 | Chen | ................... | H02M 3/1588 323/222 |
| 7,738,227 B2* | 6/2010 | Fang | ....................... | H02M 1/32 361/93.1 |
| 9,979,307 B2* | 5/2018 | Kha | ................... | H02M 3/33592 |
| 2019/0146529 A1* | 5/2019 | Mejia | ............... | G01R 19/16523 323/234 |

* cited by examiner

*Primary Examiner* — Jeffrey A Gblende
(74) *Attorney, Agent, or Firm* — Charles A. Brill; Frank D. Cimino

(57) ABSTRACT

A power stage controller includes: a reference circuit having a first reference input and a reference output, the first reference input adapted to be coupled to an input terminal of a power stage, and the reference circuit configured to adjust a reference voltage at the reference output responsive to whether a voltage at the first reference input is below a threshold; and a comparator having a current sense input, a second reference input, and a comparator output, the current sense input adapted to be coupled to a current terminal of the power stage, the second reference input coupled to the reference output, and the comparator output coupled to a driver input of a driver circuit configured to configured to control a driver output adapted to be coupled to a gate of a transistor of the power stage and responsive to the driver input.

21 Claims, 5 Drawing Sheets

POWER STAGE CONTROLLER FOR SWITCHING CONVERTER WITH CLAMP

CROSS-REFERENCE TO RELATED APPLICATION

This application claim priority to U.S. Provisional Application No. 62/932,358, filed Nov. 7, 2019, which is hereby incorporated herein by reference in its entirety.

BACKGROUND

The proliferation of electronic devices and integrated circuit (IC) technology has resulted in the commercialization of IC products. As new electronic devices are developed and IC technology advances, new IC products are commercialized. One example IC product for electronic devices is a power stage controller. An example power stage controller uses a peak current-mode control scheme. In some switching converter topologies such as Active Clamp Forward (ACF) or flyback topologies, high stress on power field-effect transistors (FETs) is likely in power down circumstances. An AFC example includes a transformer having a primary-side coil and a secondary-side coil. The primary-side coil has a first end coupled to a power supply and a second end coupled to primary-side components, such as an n-channel FET (NFET), a capacitor (CCLAMP), and a p-channel FET (PFET).

At power down, the input power rail falls, and the duty-cycle increases, to maintain the output voltage resulting in high voltage levels at some primary-side components (e.g., CCLAMP, the NFET, and the PFET) with potentially damaging overvoltage and oscillations. At the next power up, due to a pre-charged CCLAMP, the soft start could also cause transformer saturation and severe stress on switching components, such as the primary-side NFET and the secondary-side sync FET. In another scenario, switching "stops abruptly" due to a pulse-width-modulation (PWM) undervoltage lockout (UVLO) condition. In that scenario, a first sync FET has current terminals coupled between a first end of the transformer's secondary-side coil and ground. Also, a second sync FET has current terminals coupled between a second end of the transformer's secondary-side coil and ground. A PWM UVLO condition has a risk of reverse current flow ("backdrive") from the output capacitor, resulting in turning on the second sync FET once, and then both the first and second sync FETs are alternatively activated by the transformer, which causes stress to the first and second FETs. The above scenarios use NFETs with a higher voltage rating and/or PFETs with a higher current capability for each of the AFC FETs described, with severe cost consequences.

SUMMARY

In at least one example, a power stage controller includes: a driver circuit having a driver input and a driver output, the driver output adapted to be coupled to a gate of a first transistor of a power stage, and the driver circuit configured to control the driver output responsive to the driver input; a reference circuit having a first reference input and a reference output, the first reference input adapted to be coupled to an input terminal of the power stage, and the reference circuit configured to adjust a reference voltage at the reference output responsive to whether a voltage at the first reference input is below a threshold; and a comparator having a current sense input, a second reference input and a comparator output, the current sense input adapted to be coupled to a current terminal of the power stage, the second reference input coupled to the reference output, and the comparator output coupled to the driver input.

In another example, a switching converter includes a power stage having a power input, a control input, a current terminal, and a power stage output, the power input adapted to be coupled to a power supply, and the power stage output adapted to be coupled to a load; a driver circuit having a driver input and a driver output, the driver output coupled to the control input, the second driver output coupled to the second control input, and the driver circuit configured to control the driver output responsive to the driver input; a reference circuit having a first reference input and a reference output, the first reference input adapted to be coupled to an input terminal of the power stage, and the reference circuit configured to adjust a reference voltage at the reference output responsive to whether a voltage at the first reference input is below a threshold; and a comparator having a current sense input, a second reference input and a comparator output, the current sense input coupled to the current terminal, the second reference input coupled to the reference output, and the comparator output coupled to the driver input.

DETAILED DESCRIPTION

Figure 1:
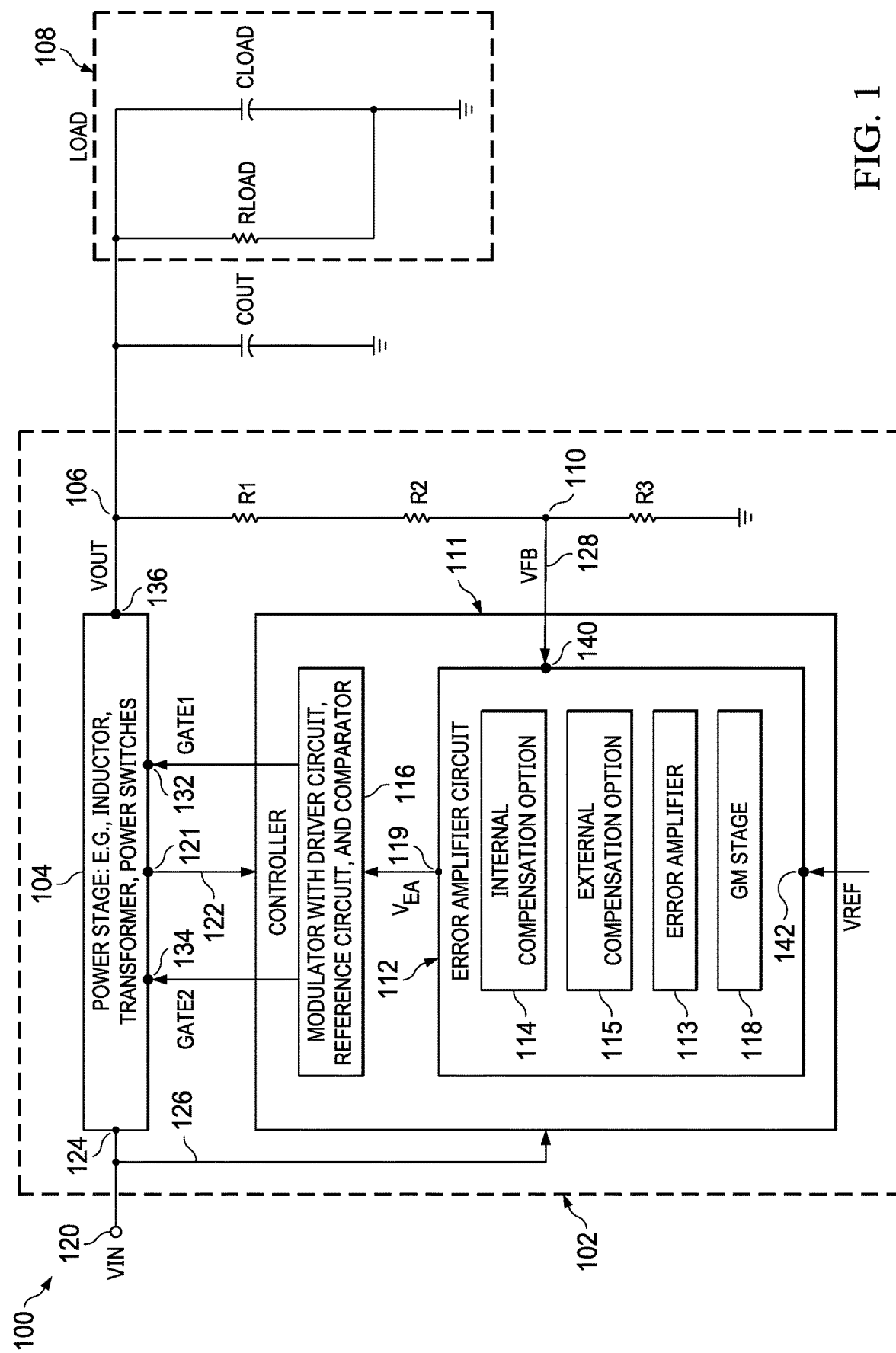
FIG. 1 is a block diagram of a system in accordance with an example embodiment.

In this description, a power stage controller (for a power stage topology, such as an Active Clamp Forward (ACF) topology, a flyback topology or other power stage topology) supports a soft stop operation. As used herein, a "soft stop" refers to operations to safely discharge the output voltage even in a light load condition (without damaging components due to high voltage or high current levels). For example, soft stop operations may be initiated responsive to the input voltage dropping below a threshold. In the described examples, the power stage controller includes a driver circuit, a reference circuit, and a comparator. To support soft stop operations, the reference output of the reference circuit is reduced responsive to detecting that an input voltage (VIN) of the power stage drops below a VIN threshold. The reference output from the reference circuit is provided to a reference input of the comparator, where the comparator uses the reference output for comparison with a current sense voltage from the power stage when the reference output is the lowest reference available. In one example, the comparator is a current limit comparator of the power stage controller. In another example, the comparator is a pulse-width modulation (PWM) comparator of the power stage controller. The comparator output is coupled directly or indirectly to the driver circuit, which generates drive signals based on the signal provided by the comparator output.

In one example, the reference circuit includes a switch coupled to a voltage source, where closing the switch adjust the voltage at the reference input of the comparator. In this example, when VIN drops below the VIN threshold, the switch closes resulting in a reduced voltage at the reference input of the comparator. In some example embodiments, the comparator has multiple reference inputs, where the lowest voltage value at the reference inputs is used as the reference threshold. In such case, the control circuit is used to adjust the voltage at one of the reference inputs of the comparator. In either case, the reference used by the comparator is reduced responsive to detecting that an input voltage (VIN) of the power stage drops below a VIN threshold.

With the described controller, a peak current is initially adjusted to a reduced value near a minimum duty cycle threshold responsive to detecting that VIN drops below the VIN threshold. The peak current value is kept at the reduced value until a signal derived from a soft start ramp goes below the reduced value. After the derived signal goes below the reduced value, the peak current is defined using the derived signal. With the described power stage controller, the soft stop will be effective immediately at high output discharge current, enabling protection for power field-effect transistors (FETs) of the power stage topology while minimizing costs with no significant system tradeoffs. To provide a better understanding, power stage controllers, and related soft stop management, power stage topologies, and systems are described using the figures as follows.

FIG. 1 is a block diagram of a system 100 in accordance with an example embodiment. As shown, the system 100 includes a switching converter 102 coupled to an output capacitor (COUT) and a load 108. In the example of FIG. 1, the load 108 is represented as a resistor (RLOAD) and a capacitor (CLOAD). In some example embodiments, the system 100 is a power-over-Ethernet (PoE) system and the load 108 is a subsequent converter having a lower output voltage (VOUT) range compared to the switching converter 102. The switching converter 102 includes a power stage 104 coupled to a controller 111. Example components of the power stage 104 includes power switches (FETs), an inductor, and a transformer. Example topologies for the power stage include ACF, flyback, or other topologies.

As shown, the controller 111 is configured to provide gate drive signals (e.g., GATE1 and GATE2) to the power stage 104, where timing of the gate drive signals is a function of VIN 126 received by the controller 111 from a VIN terminal 120 or a power stage power input 124, VOUT from an output terminal 106 (or a scaled VOUT from a voltage divider output 110), and the load 108 (e.g., a current sense voltage 122 from a current terminal 121 indicative of the load 108). In the example of FIG. 1, the controller 111 receives a feedback voltage (VFB) 128 from the voltage divider output 110, where VFB is a scaled version of VOUT, and where the scaling is performed using a voltage divider (e.g., R1, R2, R3). As shown, VFB and a reference voltage (VREF) are provided to an error amplifier circuit 112 of the controller 111. In some example embodiments, the error amplifier circuit 112 includes a first error amplifier input 140, a second error amplifier input 142, an error amplifier output 119, internal compensation option 114, an external compensation option 115, an error amplifier 113, and a transconductance stage 118.

During normal operations of the controller 111, the error amplifier circuit 112 is configured to provide an error amplifier output ($V_{EA}$) to the error amplifier output 119 based on VFB received at the first error amplifier input 140 and VREF received at the second error amplifier input 142. However, during soft stop operations of the controller 111, the error amplifier circuit 112 is bypassed and the peak current control is defined by soft stop circuitry included with the modulator 116. In the example of FIG. 1, the modulator 116 includes a driver circuit, a reference circuit, and a comparator to perform soft stop operations as described herein.

With the soft stop circuitry, the modulator 116 is configured to initially adjust a peak current to a reduced value near a minimum duty cycle threshold responsive to detecting that VIN drops below the VIN threshold. The peak current value is kept at the reduced value until a signal derived from a soft start ramp goes below the reduced value. After the derived signal goes below the reduced value, the peak current is defined using the derived signal. With the soft stop circuitry, soft stop operations of the modulator 116 will be effective immediately at high current, enabling protection for power FETs of the power stage 104 while minimizing costs with no significant system tradeoffs.

Figure 2:
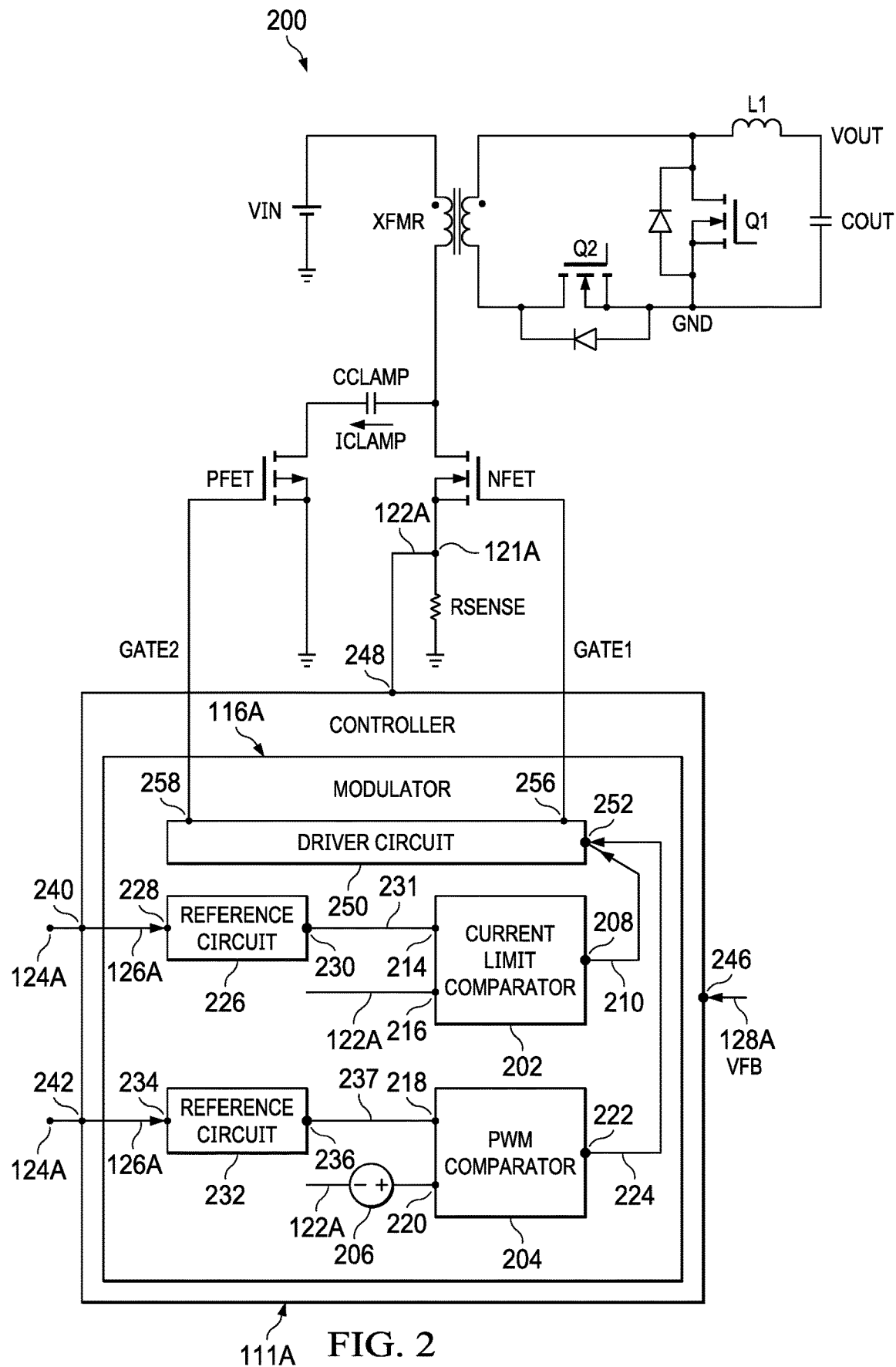
FIG. 2 is a diagram of another system in accordance with an example embodiment.

FIG. 2 is a diagram of another system 200 (e.g., an example of the system 100 in FIG. 1) in accordance with an example embodiment. In some example embodiments, the system 200 is part of a PoE adapter. In the system 200, a power stage having an ACF topology is represented, where the power stage includes a power supply (to provide VIN), and a transformer (XFMR) having a primary-side coil and secondary-side coil. More specifically, a first end of the primary-side coil is coupled to the power supply, while a second end of the primary-side coil is coupled to an n-channel FET (NFET) and to a p-channel FET (PFET). As shown, the second end of the primary-side coil has a first path to ground via NFET and a sense resistor (RSENSE), where a first end of RSENSE is coupled to a current terminal of NFET and a second end of RSENSE is coupled to ground. The second end of the primary-side coil has a second path to ground via a clamp capacitor (CCLAMP) and the PFET. The control terminals of the PFET and the NFET are coupled to a controller 111A (an example of the controller 111 in FIG. 1), where the controller 111A is configured to provide a first gate drive signal (GATE1) to the NFET and a second gate drive signal (GATE2) to the PFET. In the example of FIG. 2, GATE1 and GATE2 have the same polarity, each with some off time. As shown, the secondary-side coil is coupled to power FETs (Q1 and Q2). More specifically, a first (e.g., top) end of the secondary-side coil is coupled to ground (GND) via Q1. The first end of the second-side coil is coupled to a first end of inductor L1, where the second end of L1 is coupled to an output capacitor (COUT). Also, a second (e.g., bottom) end of the secondary-side coil is coupled to GND via Q2.

In operation, the controller 111A provides GATE1 and GATE2 to control the timing of on/off cycles of the power stage as a function of VIN, VOUT, and a load (not shown in FIG. 2) coupled in parallel with COUT. When the NFET and Q2 are on (the PFET and Q1 off), the power stage is in an "on" cycle and the energy in L1 is ramped up. When the PFET and Q1 are on (the NFET and Q2 off), the power stage is in an "off" cycle and the energy in L1 is ramped down. Because XFMR has to reset every cycle, an increase in the on-time duty cycle results in a reduction in the available reset window for XFMR. This reset goes through CCLAMP, where the amount of voltage change/current change needed to reset XFMR is a function of the available reset window. The voltage on CCLAMP affects the NFET first, then PFET. In one scenario, if there is a high voltage at CCLAMP and an on cycle with soft start, XFMR will be saturated and the NFET and the PFET will be under severe stress. Another scenario arises in which there is current flow in the reverse direction from COUT (e.g., due to a light load condition), which puts Q1 and Q2 under severe stress. In the example of FIG. 2, the controller 111A is configured to provide GATE1 and GATE2 based in part on a soft stop mechanism that enables the cost of the power stage FETs to be reduced.

In some example embodiments, the soft stop mechanism of the controller 111A is performed by a modulator 116A (an example of the modulator 116 in FIG. 1) having a driver circuit 250 coupled to a current limit comparator 202 or a PWM comparator 204. As shown, the driver circuit 250 includes a driver input 252 coupled to a comparator output 208 of the current limit comparator 202 and configured to receive signal 210, or coupled to a comparator output 222 of the PWM comparator 204 and configured to receive signal 224. The driver circuit 250 also includes driver outputs 256 and 258, where driver output 256 provides GATE1 and where driver output 258 provides GATE2 responsive to the signal 210 or signal 224 received at driver input 252. In some example embodiments, such as a flyback power stage topology, one of the FETS (e.g., PFET) could be directly driven by XFMR. In this case, GATE2 from the controller 111A is not needed and only GATE1 is provided.

In the example of FIG. 2, signal 210 is a function of a current sense voltage 122A (an example of the current sense voltage 122 in FIG. 1) provided via a controller input 248 to a current sense input 216 of the current limit comparator 202 along with a reference voltage 231 provided by a reference output 230 of a reference circuit 226 to a reference input 214 of the current limit comparator 202. As shown, the reference circuit 226 also includes a reference input 228 coupled to a power stage power input 124A (an example of the power stage power input 124 in FIG. 1) via a controller input 240 and configured to receive VIN 126A (an example of VIN 126 in FIG. 1). In operation, the reference circuit 226 is configured to adjust the reference voltage 231 (e.g., provide a reduced reference voltage) at the reference output 230 responsive to VIN 126A being below a threshold voltage.

In the example of FIG. 2, signal 224 is a function of a current sense voltage 122A plus an offset (an example of the current sense voltage 122 in FIG. 1 plus an offset, where the offset is added by a voltage source 206) provided to a current sense input 220 of the PWM comparator 204 along having a reference voltage 237 provided by a reference output 236 of a reference circuit 232 to a reference input 218 of the PWM comparator 204. As shown, the reference circuit 232 also includes a reference input 234 coupled to the power stage power input 124A (an example of the power stage power input 124 in FIG. 1) via a controller input 242 and configured to receive VIN 126A (an example of VIN 126 in FIG. 1). In operation, the reference circuit 232 is configured to adjust the reference voltage 237 (e.g., provide a reduced reference voltage) at the reference output 236 responsive to VIN 126A being below a threshold voltage. While two reference circuits 226 and 232 are shown in FIG. 2, it should be understood that only one of the reference circuits 226 and 232 is needed, and that only one of the current limit comparator 202 and the PWM comparator 204 is coupled to the reference output (e.g., the reference outputs 230 or 236) of a reference circuit. While not shown in detail in the example of FIG. 2, the controller 111A may also include an error amplifier circuit (e.g., the error amplifier circuit 112 in FIG. 1), where VFB 128A (an example of VFB 128 in FIG. 1) is provided to a control input 246 of the controller 111A. In some example embodiments, the controller 111A is configured to bypass its error amplifier circuit during soft stop operations.

In one soft stop option, a current limit comparator 202 of the modulator 116A receives a current sense voltage 122A from a current terminal 121A between the NFET and the first end of RSENSE, where the current sense voltage 122A is compared with the reference voltage 231 from a reference output 230 of the reference circuit 226. In the example of FIG. 2, reference voltage 231 is adjustable by the reference circuit 226 responsive to VIN 126A being below a VIN threshold. In one example, the reference circuit 226 is configured to reduce the reference voltage 231 responsive to detecting that VIN 126A drops below a VIN threshold.

In another soft stop option, the PWM comparator 204 of the modulator 116A receives the current sense voltage 122A from the current terminal 121A, where an offset (from a voltage source 206) is added to the current sense voltage 122A. In this soft stop option, the current sense voltage 122A plus offset (relative to the current sense voltage 122A at the current terminals 121A) is compared with a reference voltage 237 from a reference output 236 of the reference circuit 232. In the example of FIG. 2, the reference voltage 237 is adjustable by the reference circuit 232 responsive to VIN 126A being below a VIN threshold. In one example, the reference circuit 232 is configured to reduce the reference voltage 237 responsive to detecting that VIN 126A drops below a VIN threshold.

With the soft stop options represented in FIG. 2, the controller 111A is able to initially adjust a peak current to a reduced value near a minimum duty cycle threshold responsive to detecting that VIN 126A drops below the VIN threshold. The peak current value is kept at the reduced value until a signal derived from a soft start ramp goes below the reduced value. After the derived signal goes below the reduced value, the peak current is defined using the derived signal. With the described soft stop options, soft stop will be effective immediately at high current, enabling protection and reduced costs for the power FETs of the power stage (e.g., the NFET, the PFET, Q1, and Q2).

Figure 3:
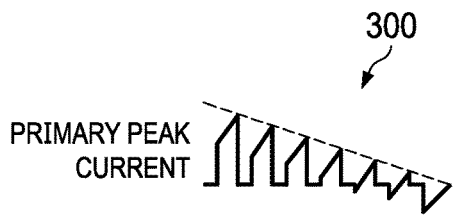
FIG. 3 is a timing diagram of a primary peak current as a function of time in accordance with a conventional slow stop technology.

FIG. 3 is a timing diagram 300 of a primary peak current as a function of time in accordance with a conventional slow stop technology. As shown in the timing diagram 300, the primary peak current is reduced slowly such that energy is not removed (represented by negative current peaks) until after some delay.

Figure 4:
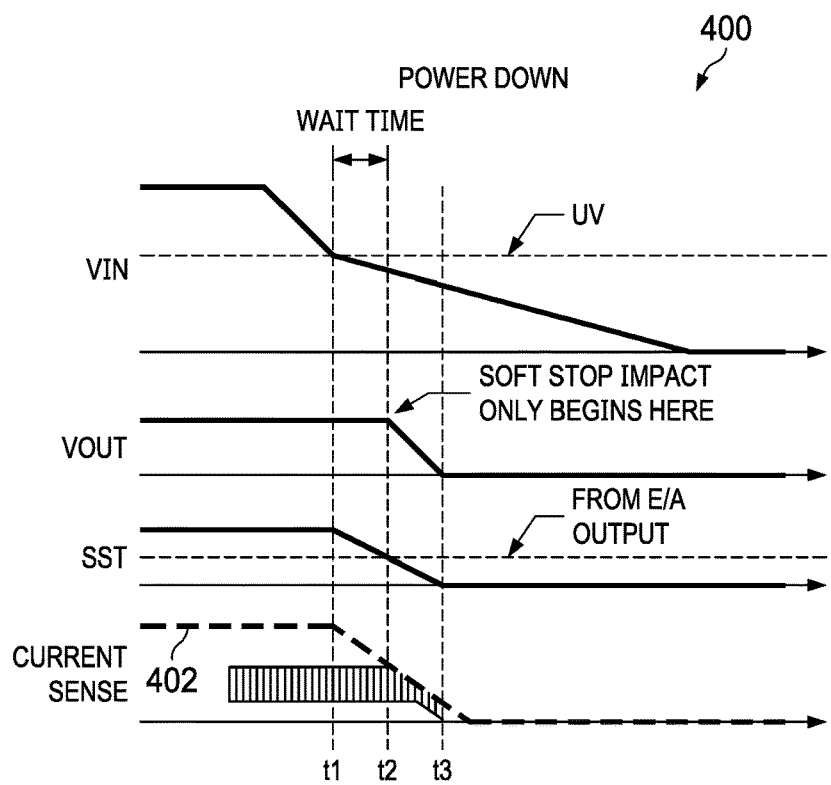
FIG. 4 is a timing diagram of waveforms as a function of time in accordance with a conventional slow stop technology.

FIG. 4 is a timing diagram 400 of waveforms as a function of time in accordance with a conventional slow stop technology (e.g., the primary peak current reduction in the timing diagram 300 of FIG. 3). As shown, the waveforms in the timing diagram 400 include VIN, VOUT, a soft start (SST) signal, a current sense voltage, and a derived signal 402 (e.g., derived from the SST signal). At time t1, VIN drops below a VIN threshold (UV), which initiates a soft stop process. The soft stop process causes the SST signal to drop slowly. However, there is some delay between when the SST signal and the derived signal 402 begin dropping at t1 and a reduction in VOUT at time t2. As shown, the current sense voltage also begins dropping at t2. Between t2 and time t3, VOUT and the current sense voltage drop as VIN, the SST signal, and the derived signal 402 continue dropping. At time t3, the soft stop process is complete.

Figure 5:
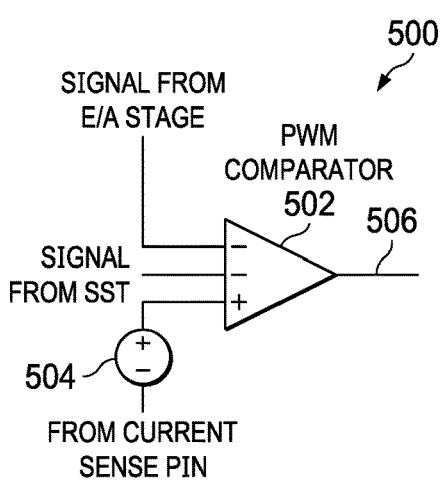
FIG. 5 is a diagram of a pulse-width modulation (PWM) comparator and inputs in accordance with a conventional slow stop technology.

FIG. 5 is a diagram of a PWM comparator 500 and inputs in accordance with a conventional slow stop technology (e.g., the primary peak current reduction in the timing diagram 300 of FIG. 3). As shown, the PWM comparator 500 is configured to a receive a current sense voltage plus an offset relative to current sense voltage at a current sense pin (the offset provided by a voltage source 504) at its non-inverting input terminal. The PWM comparator 500 is also configured to receive a SST signal and an error amplifier (E/A) signal, where the lowest of the SST signal and the E/A signal is compared with the current sense voltage plus offset relative to the current sense voltage at the current sense pin. As shown in the timing diagram 400, the soft stop is delayed until the SST signal drops below the E/A signal.

With the convention soft stop process of FIGS. 3-5, there is load-dependent wait time before soft stop becomes effective. At such, soft stop may be ineffective at lighter load level. Soft stop becomes effective once the signal derived from SST becomes lower than the voltage loop error signal (the E/A signal), which dictates the peak current. At lighter loads, the E/A signal is lower, increasing the wait time. One option to mitigate this issue include accelerating the SST signal, which however shortens the time during the soft stop can actively remove charge from the output. Another option involves tweaking system components like COUT. However, these options involve tradeoffs (cost, size) and are not sufficient solutions for applications.

Figure 6:
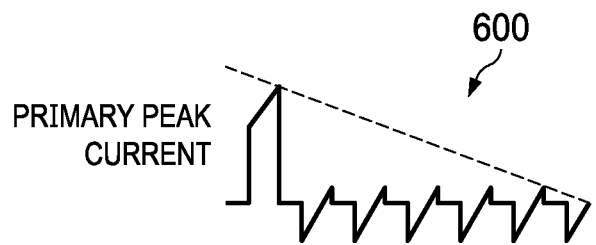
FIG. 6 is a timing diagram of a primary peak current as a function of time in accordance with an example embodiment.

FIG. 6 is a timing diagram 600 of a primary peak current as a function of time in accordance with an example embodiment. As shown in the timing diagram 600, the primary peak current is reduced quickly such that energy is removed (represented by negative current peaks) as soon as the soft start process begins.

Figure 7:
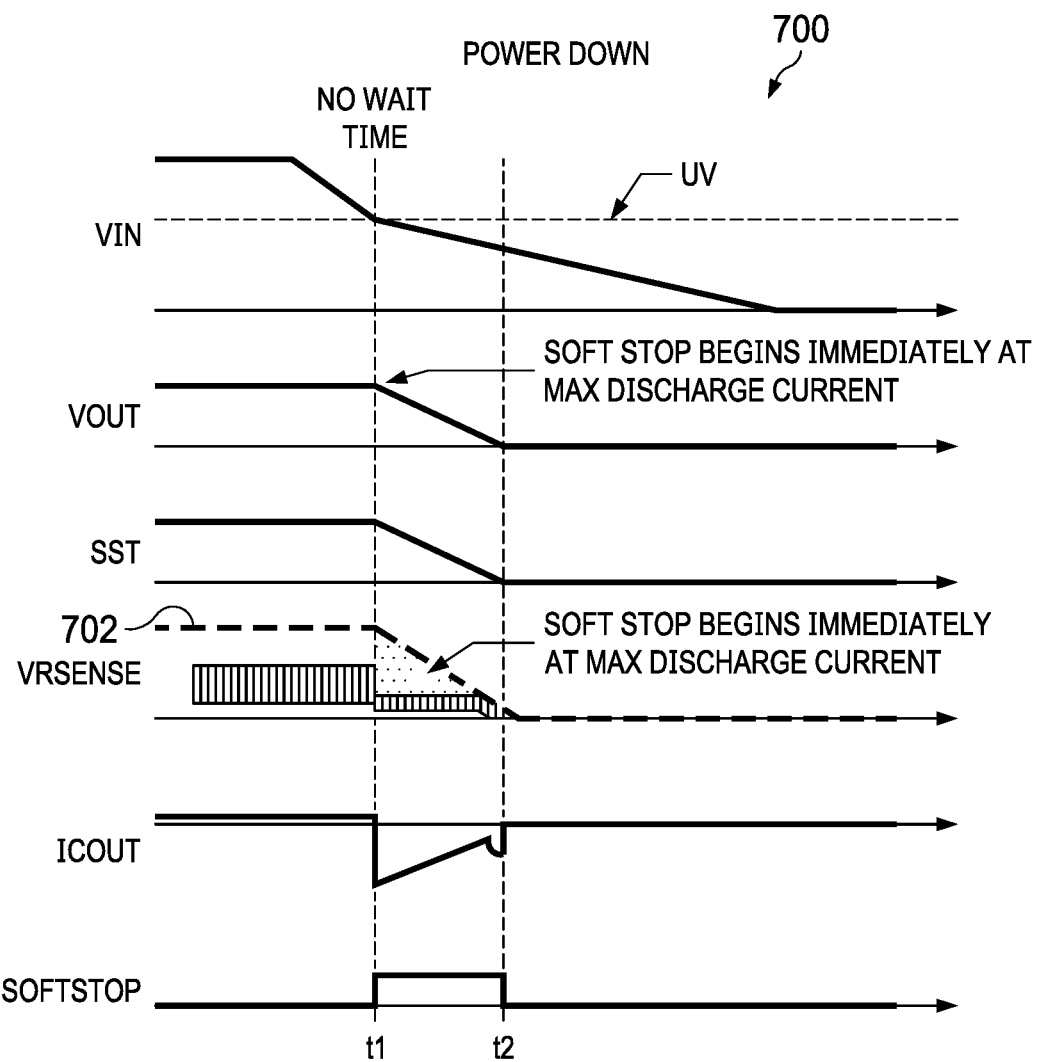
FIG. 7 is a timing diagram of waveforms as a function of time in accordance with an example embodiment.

FIG. 7 is a timing diagram 700 of waveforms as a function of time in accordance with an example embodiment (e.g., the primary peak current reduction in the timing diagram 600 of FIG. 6). As shown, the waveforms in the timing diagram 700 include VIN, VOUT, the SST signal, a current sense voltage (VRSENSE), and a derived signal 702 (e.g., derived from the SST signal), an output capacitor current (ICOUT), and a SOFTSTOP signal. At time t1, VIN drops below a VIN threshold (UV), which initiates the soft stop process. In the example of FIG. 7, the soft stop process causes VRSENSE to drop such that VOUT to begins dropping based on a maximum discharge current. As shown, the SST signal and derived signal 702 also begin to drop as well after t1. Between t1 and time t2, the soft stop process continues, where ICOUT has a large negative value at t1 and begins increasing until t2. Also, SOFTSTOP is asserted between t1 and t2. When VOUT reaches a lower target at t2, the soft stop process is over.

With the described soft stop process, VIN is monitored. When VIN drops UV, the peak current is initially adjusted to a reduced value just above the minimum duty cycle threshold. The peak current stays at the reduced value until when the derived signal 702 drops below the VRSENSE signal. Once the derived signal 702 drops below the VRSENSE signal, the peak current is defined by the derived signal 702.

Figure 8:
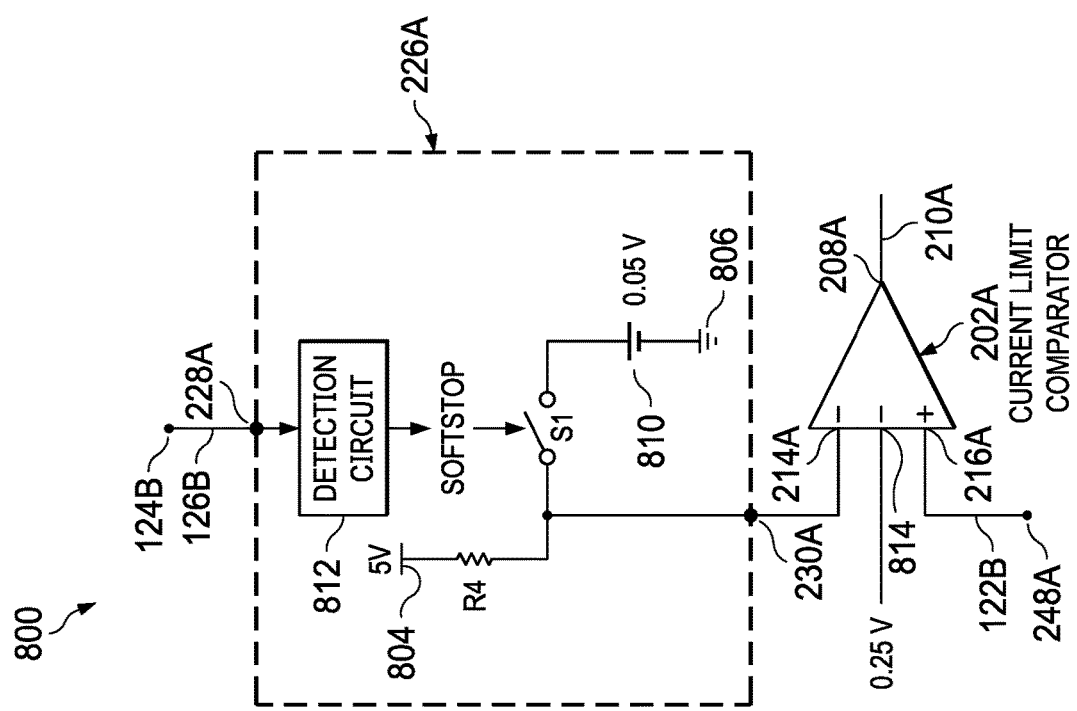
FIG. 8 is a schematic diagram of a current limit comparator and soft stop control circuit in accordance with an example embodiment.

FIG. 8 is a schematic diagram of an arrangement 800 of power stage controller components including a current limit comparator 202A (an example of the current limit comparator 202 in FIG. 2) and a reference circuit 226A (an example of the reference circuit 226 in FIG. 2) in accordance with an example embodiment. In the example of FIG. 8, the current limit comparator 202A is configured to receive a current sense voltage 122B (an example of the current sense voltage 122 in FIG. 1) from a controller input 248A (an example of the controller input 248 in FIG. 2) at its current sense input 216A (an example of the current sense input 216 in FIG. 2). The current limit comparator 202A also includes a first reference input 814 configured to receive a fixed reference threshold (e.g., 0.25V). The current limit comparator 202A also includes a second reference input 214A (an example of the reference input 214 in FIG. 2) coupled to a reference output 230A (an example of the reference output 230 in FIG. 2) of the reference circuit 226A.

In operation, the reference circuit 226A is configured to provide a reduced reference threshold (e.g., 0.05V) from a voltage source 810 to the second reference input 214A of the current limit comparator 202A responsive to VIN 126B (an example of VIN 126 in FIG. 1) being below a VIN threshold. More specifically, the reference circuit 226A includes a detection circuit 812 coupled to a reference input 228A (an example of the reference input 228 in FIG. 2) of the reference circuit 226A, where the reference input 228A is configured to receive VIN 126B (an example of VIN 126) from a power stage power input 124B (an example of the power stage power input 124 in FIG. 1). In some example embodiments, the detection circuit 812 includes a comparator configured to compare VIN 126B with a VIN threshold. If VIN 126B drops below the VIN threshold, the detection circuit 812 is configured to assert a SOFTSTOP signal. In the example of FIG. 8, the reference circuit 226A includes a switch (S1) coupled between a voltage source 810 and the second reference input 214A of the current limit comparator 202A, where S1 is controlled by the SOFTSTOP signal from the detection circuit 812. When S1 is closed, the voltage of the voltage source 810 is provided to the second reference input 214A. When S1 is open, the voltage at the second reference input 214A is a function of a power supply (e.g., 5V) at a power supply input 804 and a resistor (R4).

With the arrangement 800, the current limit comparator 202A is configured to output a signal 210A (an example of the signal 210 in FIG. 2) at comparator output 208A (an example of the comparator output 208 in FIG. 2) responsive to the current sense voltage 122B and whichever of the fixed reference at first reference input 814, or the reference voltage 231A (an example of the reference voltage 231 in FIG. 2) is lowest. In some example embodiments, the comparator output 208A is coupled to a driver circuit (e.g., the driver circuit 250 in FIG. 2).

Figure 9:
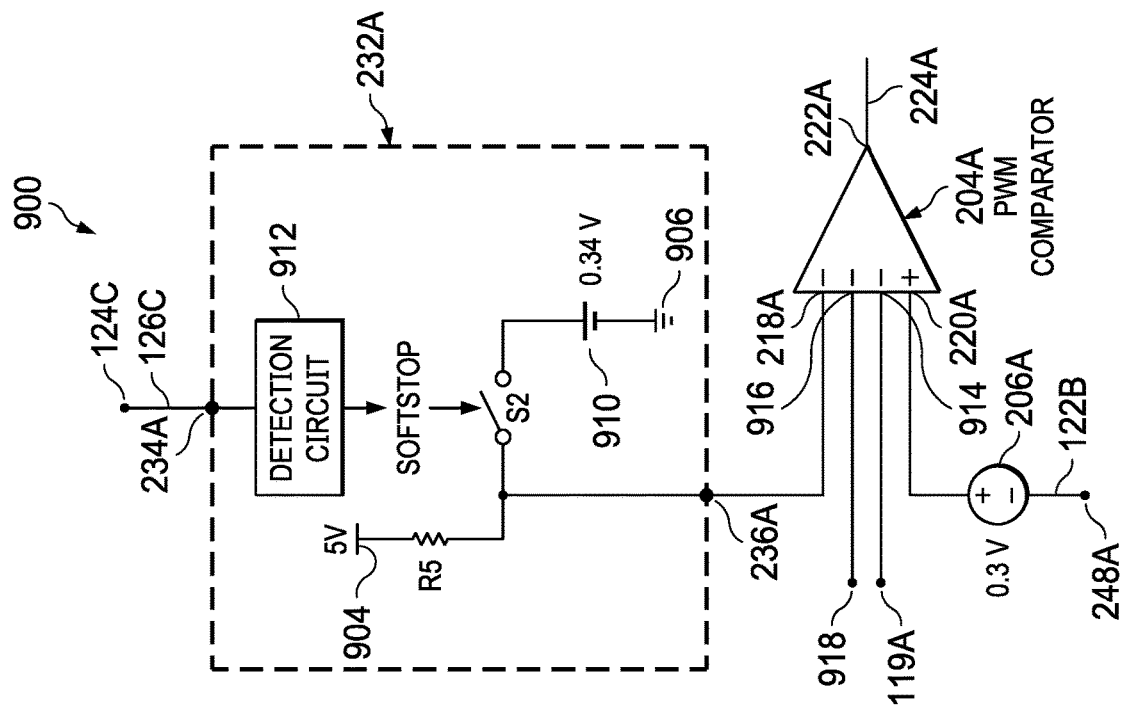
FIG. 9 is a schematic diagram of a PWM comparator and soft stop control circuit in accordance with an example embodiment.

FIG. 9 is a schematic diagram of an arrangement 900 of power stage controller components including a PWM comparator 204A (an example of the current limit comparator 204 in FIG. 2) and reference circuit 232A (an example of the reference circuit 232 in FIG. 2) in accordance with an example embodiment. In the example of FIG. 9, the PWM comparator 204A includes a current sense input 220A (an example of the current sense input 220 in FIG. 2) configured to receive a current sense voltage 122G (an example of the current sense voltage 122 in FIG. 1) plus an offset provided by a voltage source 206A (an example of the voltage source 206 in FIG. 2) from a controller input 248A (an example of the controller input 248 in FIG. 2) at its current sense input 220A. The PWM comparator 204A also includes a first reference input 914 coupled to an error amplifier output 119A (an example of the error amplifier output 119 in FIG. 1) and configured to receive a reference voltage ($V_{EA}$) from an E/A stage. The PWM comparator 204A also includes a second reference input 916 coupled to a soft start (SST) pin or terminal 918 and configured to receive a reference voltage from the SST pin or terminal 918. The PWM comparator 204A also includes a third reference input 218A (an example of the reference input 218 in FIG. 2) coupled to the reference circuit 232A.

In operation, the third reference input 218A of the PWM comparator 204A is responsive to VIN 126C (an example of VIN 126 in FIG. 1) being below a VIN threshold. More specifically, the reference circuit 232A includes a detection circuit 912 coupled to a reference input 234A (an example of the reference input 234 in FIG. 2) of the reference circuit 232A, where the reference input 234A is configured to receive VIN 126C (an example of VIN 126) from a power stage power input 124C (an example of the power stage power input 124 in FIG. 1). In some example, the detection circuit 912 includes a comparator configured to compare VIN 126C with the threshold. If VIN 126C drops below the threshold, the detection circuit 912 is configured to assert a SOFTSTOP signal.

In operation, the reference circuit 232A is configured to provide a reduced reference voltage (e.g., 0.34V) from a voltage source 910 coupled to the third reference input 218A via a switch (S2) and the reference output 236A (an example of the reference output 236 in FIG. 2). In the example of FIG. 9, the reference circuit 232A includes S2 coupled between the voltage source 910 and the third reference input 218A. When S2 is closed (by assertion of SOFTSTOP), the voltage of the voltage source 910 is provided to the third reference input 218A. When S2 is open, the voltage at the third reference input 218A is a function of the power supply (e.g., 5V) at a power supply input 904 and a resistor (R4).

With the arrangement 900, the current limit comparator 204A is configured to output a signal 224A (an example of the signal 224 in FIG. 2) at comparator output 222A (an example of the comparator output 222 in FIG. 2) responsive to the current sense voltage 1226 plus an offset (from voltage source 206A), and whichever of the voltages at first reference input 914, the second reference input 916, or the third reference input 218A is lowest. In some example embodiments, the comparator output 222A is coupled to a driver circuit (e.g., the driver circuit 250 in FIG. 2).

In some example embodiments, a power stage controller (e.g., the controller 111 in FIG. 1, or the controller 111A in FIG. 2) uses both a current limit comparator (e.g., the current sense comparator 202A in FIG. 8) and a PWM comparator (e.g., the PWM comparator 204A in FIG. 9), where one of the reference circuits and/or reference inputs is omitted (only one is needed) for soft stop adjustment. For example, a controller may employ the current sense comparator 202A along with a second comparator that is similar to the PWM comparator 204A, except that the second comparator omits the soft stop adjustment (the current sense comparator 202A still includes its soft stop adjustment).

In some example embodiments, a switching converter (e.g., the switching converter 102 in FIG. 1) includes a power stage (e.g., the power stage 104 in FIG. 1) having a power input (e.g., the power stage power input 124 in FIG. 1), a first control input (e.g., the control input 132 in FIG. 1), a second control input (e.g., the control input 134 in FIG. 1), a current terminal (e.g., the current terminal 121 in FIG. 1), and a power stage output (e.g., the power stage output 136 in FIG. 1), the power input adapted to be coupled to a power supply (e.g., VIN source in FIGS. 1 and 2), and the power stage output adapted to be coupled to a load (e.g., load 108 in FIG. 1). The switching converter also includes a power stage controller (e.g., the controller 111 in FIG. 1, or the controller 111A in FIG. 2), where the power stage controller includes: a driver circuit (e.g., driver circuit 250 in FIG. 2) having a driver input (e.g., driver input 252 in FIG. 2) and a driver output (e.g., driver output 256 and/or 258 in FIG. 2). In one example, the driver output (e.g., the driver output 256 in FIG. 2) is adapted to be coupled to a gate of a first transistor (NFET in FIG. 2) of a power stage, and the driver circuit is configured to control the driver output responsive to the driver input. In another example, the driver output (e.g., the driver output 258 in FIG. 2) is adapted to be coupled to a gate of a second transistor (e.g., PFET in FIG. 2) of the power stage, and the driver circuit is configured to control the driver output responsive to the driver input.

In another example embodiment, the power stage controller includes: a driver circuit (e.g., driver circuit 250 in FIG. 2) having a driver input (e.g., driver input 252 in FIG. 2) and first and second driver outputs (e.g., driver output 256 and 258 in FIG. 2). In this examples, the first driver output is adapted to be coupled to a gate of a first transistor (e.g., NFET in FIG. 2) of a power stage, the second driver output is adapted to be coupled to a gate of a second transistor (PFET in FIG. 2) of a power stage, and the driver circuit is configured to control the first and second driver outputs responsive to the driver input.

The power stage controller also includes a reference circuit (e.g., reference circuit 226 or 232 in FIG. 2) having a first reference input (reference input 228 or 234 in FIG. 2, reference input 228A in FIG. 8, or reference input 234A in FIG. 9) and a reference output (e.g., reference outputs 230 or 236 in FIG. 2, reference output 230A in FIG. 8, or reference output 2366A in FIG. 9), the first reference input adapted to be coupled to an input terminal (e.g., power stage power input 124 in FIG. 1) of the power stage, and the reference circuit configured to adjust a reference voltage (e.g., reference voltage 231 or 237 in FIG. 2) at the reference output responsive to whether a voltage at the first reference input is below a threshold. The power stage controller also includes a comparator (e.g., the current limit comparator 202 in FIG. 2, or the PWM comparator 204 in FIG. 2) having a current sense input (e.g., current sense input 216 or 220 in FIG. 2, the current sense input 216A in FIG. 8, or the current sense input 220A in FIG. 9), a second reference input (e.g., reference input 214 or 218 in FIG. 2, reference input 214A in FIG. 8, or reference input 218A in FIG. 9) and a comparator output (e.g., comparator outputs 208 or 222 in FIG. 2, comparator output 208A in FIG. 8, or comparator output 222A in FIG. 9), the current sense input adapted to be coupled to a current terminal (e.g., current terminal 121A in FIG. 2) of the power stage, the second reference input of the comparator coupled to the reference output, and the comparator output coupled to the driver input.

In some example embodiments, the comparator is a current limit comparator (e.g., the current limit comparator 202 in FIG. 2, or the current limit comparator 202A in FIG. 8) having a third reference input (e.g., reference input 814 in FIG. 8), the current sense input is configured to receive a current sense voltage from the current terminal, and the current limit comparator is configured to provide a comparison signal (e.g., signal 210A in FIG. 8) at the comparator output (e.g., comparator output 208A in FIG. 8) responsive to a comparison between: the current sense voltage; and a voltage at the second reference input or a voltage at the third reference input, whichever is lower. In some example embodiments, the reference circuit (e.g., the reference circuit 226A in FIG. 8) is configured to adjust the reference voltage at the reference output to a voltage below 0.1 (e.g., 0.05 V in FIG. 8) responsive to the voltage at the first reference input (e.g., the reference input 228A in FIG. 8) being below the threshold.

In some example embodiments, the current sense voltage (e.g., the current sense voltage 122B in FIG. 8) is a first current sense voltage, the current sense input is a first current sense input, the comparator is a first comparator (e.g., comparator 202A), the reference voltage is a first reference voltage, and the power stage controller further comprises: an error amplifier circuit (e.g., the error amplifier circuit 112 in FIG. 1) having a first error amplifier input (e.g., the first error amplifier input 140 in FIG. 1), a second error amplifier input (e.g., the second error amplifier input 142 in FIG. 1) and an error amplifier output (e.g., the error amplifier output 119 in FIG. 1), the first error amplifier input adapted to be coupled to an output terminal (e.g., output terminal 136 in FIG. 1) of the power stage, and the second error amplifier input configured to receive a second reference voltage; and a second comparator (e.g., the PWM comparator 204A in FIG. 9 without the reference input 218A) having: a second current sense input (e.g., the current sense input 220A in FIG. 9) configured to receive a second current sense voltage (e.g., the current sense voltage 122B plus offset) offset from the first current sense voltage (e.g., the current sense voltage 122B); and a fourth reference input (e.g., the reference input 914 in FIG. 9) coupled to the error amplifier output.

In some example embodiments, the current terminal (e.g., the current terminal 121 in FIG. 1) is configured to provide a first current sense voltage (e.g., the current sense voltage 122 in FIG. 1), the reference voltage is a first reference voltage, the comparator is a pulse-width modulation (PWM) comparator (e.g., the PWM comparator 204A in FIG. 9) having a third reference input (e.g., the reference input 914 in FIG. 9), the current sense input (e.g., the current sense input 220A in FIG. 9) is configured to receive a second current sense voltage (e.g., the current sense voltage 122A in FIG. 9 plus offset) offset from the first current sense voltage (e.g., the current sense voltage 122A), and the PWM comparator is configured to provide a comparison signal (e.g., signal 224A in FIG. 9) at the comparator output (e.g., comparator output 222A in FIG. 9) responsive to a comparison between: the second current sense voltage; and a voltage at the second reference input (e.g., the reference input 218A in FIG. 9) or a voltage at the third reference input (e.g., the reference input 914 in FIG. 9), whichever is lower; the power stage controller further comprising: an error amplifier circuit (e.g., the error amplifier circuit 112 in FIG. 1) having a first error amplifier input (e.g., the first error amplifier input 140 in FIG. 1), a second error amplifier input (e.g., the second error amplifier input 142 in FIG. 1) and an error amplifier output (e.g., the error amplifier output 119 in FIG. 1), the first error amplifier input adapted to be coupled to an output terminal (e.g., output terminal 136 in FIG. 1) of the power stage, the second error amplifier input configured to receive a second reference voltage, and the error amplifier output coupled to the third reference input. In some example embodiments, the reference circuit is configured to adjust the reference voltage at the reference output to a voltage below 0.4 V (e.g., 0.34 V in FIG. 9) responsive to the voltage at the first reference input being below the threshold.

In some example embodiments, the power stage controller is an integrated circuit comprising the driver circuit, the reference circuit, and the comparator. In some example embodiments, the reference circuit has first and second voltage source terminal (e.g., the terminals of voltage source 810 FIG. 8, or the terminals of voltage source 910 in FIG. 9), a switch (e.g., S1 in FIG. 8, or S2 in FIG. 9) coupled between the reference output (e.g., reference output 230A in FIG. 8, or reference output 236A in FIG. 9) and the first voltage source terminal, the switch configured to close responsive to a control signal (e.g., SOFTSTOP in FIG. 8 or 9); and a detection circuit (e.g., detection circuit 812 in FIG. 8, or detection circuit 912 in FIG. 9) having a detection circuit input (the input of detection circuit 812 or 912) and a detection circuit output (the output of the detection circuit 812 or 912), the detection circuit input coupled to the first reference input (e.g., reference input 228A in FIG. 8, or reference input 234A in FIG. 9), the detection circuit output coupled to the switch, and the detection circuit configured to provide the control signal at the detection circuit output responsive to the voltage at the detection circuit input being below the threshold. In some example embodiments, the reference circuit has a power supply input (e.g., the power supply input 804 in FIG. 8, or the power supply input 904 in FIG. 9), a ground terminal (e.g., the ground terminal 806 in FIG. 8, or the ground germinal 906 in FIG. 9) and a resistor (e.g., R4 in FIG. 8, or R5 in FIG. 9), a first end of the resistor coupled to the power supply input, a second end of the resistor coupled to a first end of the switch and to the second reference input (e.g., reference input 214A in FIG. 8, or reference input 218A in FIG. 9), and the second voltage source terminal coupled between a second end of the switch and the ground terminal.

In some example embodiments, the power stage controller is configured to: initially adjust a peak current of an output inductor (e.g., L1 in FIG. 2) of the power stage to a reduced level near a minimum duty cycle threshold responsive to the voltage at the reference input being below the threshold; keep the peak current at the reduced level until a control ramp (e.g., the derived signal 702) derived from input-side energy of the power stage goes below the reduced level; and define the peak current using the control ramp after the control ramp goes below the reduced level. In some example embodiments, the power stage has an ACF topology (e.g., the power stage topology of FIG. 2). In some example embodiments, the control ramp is a function of the voltage at the power stage power input 124 in FIG. 1 as well as magnetizing inductance of a primary-side coil of a transformer (e.g., XFMR in FIG. 2) if the power stage uses a transformer. In some example embodiments, the power stage has an flyback topology.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:
1. A power stage controller, comprising:
a driver circuit having a driver input and a driver output, the driver output coupled to a power stage control terminal, and the driver circuit configured to provide a driver signal at the driver output responsive to a state of the driver input;

a reference circuit having a first reference input and a reference output, the first reference input coupled to a power stage input terminal, and the reference circuit configured to:
  determine whether a voltage at the first reference input is below a threshold voltage, and generate a decision signal responsive thereto;
  provide a first reference voltage at the reference output responsive to the decision signal having a first state; and
  provide a second reference voltage at the reference output responsive to the decision signal having a second state; and
a comparator having a current sense input, a second reference input and a comparator output, the current sense input coupled to a power stage current terminal, the second reference input coupled to the reference output, and the comparator output coupled to the driver input.

2. The power stage controller of claim 1, wherein the voltage is a first voltage, the comparator has a third reference input coupled to a reference terminal, and the comparator is configured to:
  if a second voltage at the third reference input is lower than the one of the first or second reference voltages, provide a comparison signal at the comparator output responsive to a third voltage at the current sense input and the second voltage; and
  if the second voltage is higher than the one of the first or second reference voltages, provide the comparison signal at the comparator output responsive to the third voltage and the one of the first or second reference voltages.

3. The power stage controller of claim 1, wherein the voltage is a first voltage, the current sense input is a first current sense input, the comparator is a first comparator, the comparator output is a first comparator output, and the power stage controller further comprises:
  an error amplifier circuit having a first error amplifier input, a second error amplifier input and an error amplifier output, the first error amplifier input coupled to a power stage output terminal, the second error amplifier input coupled to a reference terminal, and the error amplifier circuit configured to generate an error signal at the error amplifier output responsive to a second voltage at the first error amplifier input and a third reference voltage at the reference terminal; and
  a second comparator having a second current sense input, a third reference input, and a second comparator output, the second current sense input coupled to the power stage current terminal, the third reference input coupled to the error amplifier output, and the second comparator output coupled to the driver input.

4. The power stage controller of claim 1, wherein the voltage is a first voltage, and the power stage controller further comprises an error amplifier circuit having a first error amplifier input, a second error amplifier input and an error amplifier output, the first error amplifier input coupled to a power stage output terminal, and the second error amplifier input coupled to a reference terminal; and
  wherein the comparator has a third reference input, the third reference input coupled to the error amplifier output, and the comparator is configured to:
    if a second voltage at the third reference input is lower than the one of the first or second reference voltages, provide a comparison signal at the comparator output responsive to a third voltage at the current sense input and the second voltage; and
    if the second voltage is higher than the one of the first or second reference voltages, provide the comparison signal at the comparator output responsive to the third voltage and the one of the first or second reference voltages.

5. The power stage controller of claim 4, wherein the comparator has a fourth reference input coupled to a soft start (SST) terminal, and the comparator is configured to:
  if a fourth voltage at the fourth reference input is lower than the second voltage and the one of the first or second reference voltages, provide the comparison signal at the comparator output responsive to the third voltage and the fourth voltage; and
  if the one of the first or second reference voltages is lower than both the second and fourth voltages, provide the comparison signal at the comparator output responsive to the third voltage and the one of the first or second reference voltages.

6. The power stage controller of claim 1, wherein the power stage controller is an integrated circuit comprising the driver circuit, the reference circuit, and the comparator.

7. The power stage controller of claim 1, wherein the reference circuit includes:
  first and second voltage source terminals;
  a switch coupled between the reference output and the first voltage source terminal; and
  a detection circuit having a detection circuit input and a detection circuit output, the detection circuit input coupled to the first reference input, the detection circuit output coupled to a control terminal of the switch, and the detection circuit configured to control a state of the switch responsive to the decision signal.

8. The power stage controller of claim 7, wherein the reference circuit has a resistor coupled between the second voltage source terminal and the reference output.

9. The power stage controller of claim 1, wherein the driver signal is a first driver signal, and power stage includes:
  an inductor having a first inductor terminal and a second inductor terminal, the first inductor terminal coupled to the power stage input terminal;
  a first transistor having a first control terminal and first and second current terminals, the first current terminal coupled to the second inductor terminal, the second current terminal coupled to the power stage current terminal;
  a second transistor having a second control terminal and third and fourth current terminals, the third current terminal coupled to a ground terminal; and
  a capacitor coupled between the second and fourth current terminals; and
  wherein the driver output is a first driver output coupled to the first control terminal, the driver circuit has a second driver output coupled to the second control terminal, and the driver circuit is configured to, responsive to the state of the driver input, provide first and second driver signals at the respective first and second driver outputs.

10. The power stage controller of claim 1, wherein the power stage controller is configured to adjust a current that flows through an inductor of a power stage responsive to the decision signal.

11. A switching converter, comprising:
a power stage having a power stage input, a control input, a current terminal and a power stage output, the power stage input coupled to a power supply terminal;
a driver circuit having a driver input and a driver output, the driver output coupled to the control input, and the driver circuit configured to provide a driver signal at the driver output responsive to a state of the driver input;
a reference circuit having a first reference input and a reference output, the first reference input coupled to the power stage input, and the reference circuit configured to:
determine whether a voltage at the first reference input is below a threshold voltage, and generate a decision signal responsive thereto;
provide a first reference voltage at the reference output responsive to the decision signal having a first state; and
provide a second reference voltage at the reference output responsive to the decision signal having a second state;
a comparator having a current sense input, a second reference input, and a comparator output, the current sense input coupled to the current terminal, the second reference input coupled to the reference output, and the comparator output coupled to the driver input.

12. The switching converter of claim 11, wherein the voltage is a first voltage, the comparator has a third reference input coupled to a reference terminal, and the comparator is configured to:
if a second voltage at the third reference input is lower than the one of the first or second reference voltages, provide a comparison signal at the comparator output responsive to a third voltage at the current sense input and the second voltage; and
if the second voltage is higher than the one of the first or second reference voltages, provide the comparison signal at the comparator output responsive to the third voltage and the one of the first or second reference voltages.

13. The switching converter of claim 12, wherein the voltage is a first voltage, the current sense input is a first current sense input, the comparator is a first comparator, the comparator output is a first comparator output, and the switching converter further comprises:
an error amplifier circuit having a first error amplifier input, a second error amplifier input and an error amplifier output, the first error amplifier input coupled to the power stage output, and the second error amplifier input configured to generate an error signal at the error amplifier output responsive to a second voltage at the first error amplifier input and a third reference voltage at the reference terminal; and
a second comparator having a second current sense input, a third reference input, and a second comparator output, the second current sense input coupled to the current terminal, the third reference input coupled to the error amplifier output, and the second comparator output coupled to the driver input.

14. The switching converter of claim 11, wherein the voltage is a first voltage, the current sense input is a first current sense input, and the switching converter further comprises an error amplifier circuit having a first error amplifier input, a second error amplifier input and an error amplifier output, the first error amplifier input coupled to a power stage output terminal, and the second error amplifier input coupled to a reference terminal; and
wherein the comparator has a third reference input, the third reference input coupled to the error amplifier output, and the comparator is configured to:
if a second voltage at the third reference input is lower than the one of the first or second reference voltages, provide a comparison signal at the comparator output responsive to a third voltage at the current sense input and the second voltage; and
if the second voltage is higher than the one of the first or second reference voltages, provide the comparison signal at the comparator output responsive to the third voltage and the one of the first or second reference voltages.

15. The switching converter of claim 14, wherein the switching converter comprises an integrated circuit having a power stage controller separate from the power stage, the power stage controller including the driver circuit, the reference circuit, and the comparator.

16. The switching converter of claim 15, wherein the power stage includes an inductor, and the power stage controller is configured to adjust a current that flows through the inductor responsive to a comparison signal at the comparator output.

17. The switching converter of claim 11, wherein the reference circuit includes:
first and second voltage source terminals;
a switch coupled between the reference output and the first voltage source terminal, the switch configured to close responsive to a control signal; and
a detection circuit having a detection circuit input and a detection circuit output, the detection circuit input coupled to the first reference input, the detection circuit output coupled to a control terminal of the switch, and the detection circuit configured to control a state of the switch responsive to the decision signal.

18. The switching converter of claim 17, wherein the reference circuit includes a resistor coupled between the second voltage source terminal and the reference output.

19. The switching converter of claim 11, wherein the power stage includes:
an inductor having a first inductor terminal and a second inductor terminal, the first inductor terminal coupled to the power stage input;
a first transistor having a first control terminal and first and second current terminals, the first current terminal coupled to the second inductor terminal, the second current terminal coupled to the current terminal;
a second transistor having a second control terminal and third and fourth current terminals, the third current terminal coupled to a ground terminal; and
a capacitor coupled between the second and fourth current terminals; and
wherein the driver output is a first driver output coupled to the first control terminal, the driver circuit has a second driver output coupled to the second control terminal, and the driver circuit is configured to, responsive to the state of the driver input, provide first and second driver signals at the respective first and second driver outputs.

20. The switching converter of claim 11, wherein the power stage has an Active Clamp Forward (ACF) topology.

21. The switching converter of claim 11, wherein the power stage has a flyback topology.

* * * * *